US009277669B2

(12) United States Patent
Oh et al.

(10) Patent No.: US 9,277,669 B2
(45) Date of Patent: Mar. 1, 2016

(54) PLASTIC PANEL AND FLAT PANEL DISPLAY DEVICE USING THE SAME

(71) Applicant: LG DISPLAY CO., LTD., Seoul (KR)

(72) Inventors: ChungWan Oh, Osan-si (KR); HoWon Son, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 245 days.

(21) Appl. No.: 13/938,887

(22) Filed: Jul. 10, 2013

(65) Prior Publication Data

US 2014/0029219 A1     Jan. 30, 2014

(30) Foreign Application Priority Data

Jul. 25, 2012   (KR) .................... 10-2012-0081070

(51) Int. Cl.
| | |
|---|---|
| H05K 1/00 | (2006.01) |
| H05K 1/18 | (2006.01) |
| H05K 7/06 | (2006.01) |
| G02F 1/1345 | (2006.01) |
| H05K 3/36 | (2006.01) |
| H05K 1/11 | (2006.01) |
| H05K 7/12 | (2006.01) |
| H05K 7/00 | (2006.01) |
| G02F 1/167 | (2006.01) |
| G02F 1/13 | (2006.01) |
| G02F 1/1333 | (2006.01) |

(52) U.S. Cl.
CPC .............. *H05K 7/06* (2013.01); *G02F 1/13452* (2013.01); *G02F 1/13454* (2013.01); *H05K 1/118* (2013.01); *H05K 1/189* (2013.01); *H05K 3/361* (2013.01); *G02F 1/1309* (2013.01); *G02F 1/13458* (2013.01); *G02F 1/133305* (2013.01); *G02F 1/167* (2013.01)

(58) Field of Classification Search
CPC .......... G02F 1/133305; G02F 1/13452; G02F 1/13454; H05K 3/361; H05K 1/189; H05K 1/118
USPC ......... 361/748, 749, 750, 760, 761, 762, 764, 361/767, 772, 777, 783, 784; 428/1.1, 1.6, 428/1.61; 349/150, 151, 152
See application file for complete search history.

(56) References Cited

U.S. PATENT DOCUMENTS

| | | | |
|---|---|---|---|
| 2002/0135543 A1 * | 9/2002 | Kitamura et al. ............... | 345/55 |
| 2002/0140669 A1 | 10/2002 | Hsu | |
| 2006/0113903 A1 | 6/2006 | Kim | |

(Continued)

FOREIGN PATENT DOCUMENTS

CN        2768128 Y       3/2006

*Primary Examiner* — Hoa C Nguyen
*Assistant Examiner* — Binh Tran
(74) *Attorney, Agent, or Firm* — Birch, Stewart, Kolasch & Birch, LLP

(57) ABSTRACT

A plastic display panel and a flat panel displaying having the plastic display panel are discussed. The plastic display panel according to an embodiment a display area configured to display an image and including a plurality of panel electrodes, and a non-display area in which a plurality of link lines connected to the panel electrodes and a driving element are provided. The display area and the non-display area are provided in a plastic base substrate. A plurality of link pads, electrically connected to the respective link lines, are provided in a bonding part adhered to the driving element in the non-display area, and at least one via hole is provided in the bonding part for exposing a portion of the plastic base substrate.

18 Claims, 6 Drawing Sheets

(56) References Cited

U.S. PATENT DOCUMENTS

| | | |
|---|---|---|
| 2008/0001892 A1 | 1/2008 | Kim et al. |
| 2009/0167654 A1 | 7/2009 | Kim et al. |
| 2010/0002180 A1* | 1/2010 | Kim et al. .................... 349/143 |
| 2010/0277448 A1* | 11/2010 | Okamoto et al. ............. 345/206 |
| 2011/0092006 A1 | 4/2011 | An et al. |
| 2011/0134056 A1 | 6/2011 | Kim et al. |
| 2012/0127412 A1 | 5/2012 | Lee et al. |

* cited by examiner

PLASTIC PANEL AND FLAT PANEL DISPLAY DEVICE USING THE SAME

CROSS-REFERENCE TO RELATED APPLICATIONS

This application claims the priority benefit of the Korean Patent Application No. 10-2012-0081070 filed on Jul. 25, 2012, which is hereby incorporated by reference as if fully set forth herein.

BACKGROUND

1. Field of the Invention

The present invention relates to a display panel applied to flat panel display devices, and particularly, to a plastic display panel and a flat panel display device having the plastic display panel.

2. Discussion of the Related Art

Flat panel display (FPD) devices are applied to various electronic products such as portable phones, tablet personal computers (PCs), notebook computers, etc.

The FPD devices include liquid crystal display (LCD) devices, plasma display panels (PDPs), organic light emitting diode (OLED) display devices, etc. Recently, electrophoretic display (EPD) devices are widely used as the FPD devices.

FIG. 1 is a view schematically illustrating a configuration of a general FPD device having a non-plastic display panel. FIG. 2 is a sectional view of an example illustrating a state in which the display panel of FIG. 1 is adhered to a driving integrated circuit (IC) by a conductive member according to a related art.

The FPD device, as illustrated in FIG. 1, includes a display panel 10 that displays an image, a printed circuit board (PCB, main board) 70 on which various circuit components are mounted, a flexible printed circuit (FPC) 60 that electrically connects the PCB 70 to the display panel 10, and a driving IC (D-IC) 20 that is mounted on a lower substrate 15 of the display panel 10 and drives the display panel 10 according to electrical signals transferred from the PCB 70 through the FPC 60.

The display panel 10 may be of various types of panels, such as a liquid crystal panel, a PDP, an organic light emitting display panel, an EPD panel, etc., depending on the types of the above-described FPD devices. Generally, the display panel 10 is configured with an upper substrate 16 and the lower substrate 15.

The display panel 10 includes a display area that displays an image, and a non-display area that does not and cannot display an image. A plurality of output link lines 30 electrically linking the driving IC 20 to a plurality of panel lines (e.g., gate lines and/or data lines) disposed in the display area of the display panel 10, and a plurality of input link lines 50 electrically linking the driving IC 20 to the FPC 60, are arranged in the non-display area of the display panel 10. The lower substrate 15 of the display panel 10 includes a non-plastic base substrate 11 on which the link lines 30, 50 are formed, and an insulating layer 12 and a passivation layer 13 covering the link lines 30, 50 over the base substrate 11.

The driving IC 20 may be a data driver IC for driving the data lines of the display panel 10, a gate driver IC for driving the gate lines of the display panel 10, or a display driver IC (DDI) for integratedly driving the data lines and the gate lines. In FIG. 1, the driving IC 20 is a display driver IC.

In a chip-on glass (COG) type in which the driving IC 20 is directly mounted on the display panel 10, as illustrated in FIG. 1, when an anisotropic conductive member 40, such as an anisotropic conductive film (ACF), is disposed between the plurality of link lines 30 and 50 and the driving IC 20 and is pressed against the lower substrate 15 of the display panel 10 by the pressing of the driving IC 20, the driving IC 20 is electrically connected to the link lines 30 and 50.

To this end, as illustrated in FIG. 2, a link terminal (bump) 21 is disposed at one side surface of the driving IC 20 corresponding to the link lines 30 and 50, and thus, when the driving IC 20 is pressed downwardly, a lower side surface of the link terminal 21 presses on a conductive ball 42 included in the conductive member 40 and is hardened, thereby electrically linking the link lines 30 and 50 to the driving IC 20. In this case, a plurality of transparent electrodes 31 and 51 are formed on the link lines 30 and 50, for assisting the electrical connections between the link terminal 21 and the link lines 30 and 50.

In this case, a sufficient number of conductive balls 42 are compressed or pressed by the link terminal 21 to ensure electrical connection between the display panel 10 (e.g., link lines 30, 50) and the driving IC 20. Therefore, the above-described compression/pressing process necessarily needs an operation that tests whether the conductive balls 42 are sufficiently pressed by the link terminal 21, which indicates a proper and sufficient electrical connection between the link lines 30, 50 and the driving IC 20.

To this end, a scheme may be used in which a microscope is disposed under the non-plastic display panel 10 so as to check fine indentations 32 and 52 formed on the transparent electrodes 31 and 51 or the link lines 30 and 50 through the display panel 10, and a camera captures images of the indentations 32 and 52 checked by the microscope to acquire image data. Here, the indentations 32, 52 denote squashed marks that, when the conductive ball 42 is compressed between the link terminal 21 and the lower substrate 15 of the display panel 10, are formed on the transparent electrodes 31 and 51 or the link lines 30 and 50 due to the dent made by the conductive ball 42. That is, if there is a sufficient number of indentations 32, 52 made by the conductive ball 42, then that denotes that the link lines 30 and 50 are closely adhered to the link terminal 21, and denotes that the link terminals 21 are electrically connected to the link lines 30 and 50.

In contrast to the non-plastic panel of FIG. 1, recently, the use of FPD devices using a plastic panel, which is not damaged even when being folded or rolled, is increasing.

Especially, e-books which users can carry and use are manufactured with an EPD panel, in consideration of characteristics in which power consumption is low, the cost is low, and the e-book is accommodated and kept in a space with various articles placed therein like bags. The EPD panel is manufactured as a plastic display panel.

In addition to the e-books, various electronic products are manufactured with the plastic display panel for a portability reason. In addition to the EPD panels, liquid crystal panels, plasma display panels, organic light emitting display panels, etc. may be manufactured as the plastic display panels.

Here, the plastic panel denotes a display panel in which a base substrate configuring the display panel is formed of a synthetic resin such as plastic. When manufacturing the plastic display panels, however, a test is needed to verify that the driving ICs are in electrical contact with the link lines of the lower substrate of the plastic display panel.

SUMMARY

Accordingly, the present invention is directed to provide a plastic display panel and a flat panel display device using the same that substantially obviate one or more problems due to limitations and disadvantages of the related art.

An aspect of the present invention is directed to provide a plastic display panel and an FPD device using the same, in which a plurality of link pads electrically connected to a plurality of panel lines in a display area and a test pad, which is not electrically connected to the panel lines in the display area, is provided in a bonding part adhered to a driving element.

Another aspect of the present invention is to provide a method of verifying a proper electrical contact between the panel lines (e.g., gate lines, data lines, etc.) of the display area and the driving ICs of the plastic display devices.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided according to an embodiment of the present invention a plastic panel including: a display area configured to display an image and including a plurality of panel electrodes; and a non-display area in which a plurality of link lines connected to the panel electrodes and a driving element are provided, wherein, the display area and the non-display area are provided in a plastic base substrate, a plurality of link pads, electrically connected to the respective link lines, are provided in a bonding part adhered to the driving element in the non-display area, and at least one via hole is provided in the bonding part for exposing a portion of the plastic base substrate.

In another aspect of the present invention, there is provided a flat panel display device including a plastic display panel including a base substrate made of plastic and a plurality of data lines and gate lines formed on the plastic base substrate; and a driving element configured to apply electrical signals to at least one of the data and gate lines, wherein the plastic display panel further includes: a plurality of link pads formed on the plastic base substrate, each of the link pads electrically connected to one of the data and gate lines, a plurality of via holes disposed adjacent to the link pads on the plastic base substrate, and a plurality of conductive elements formed in the plurality of via holes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 3:
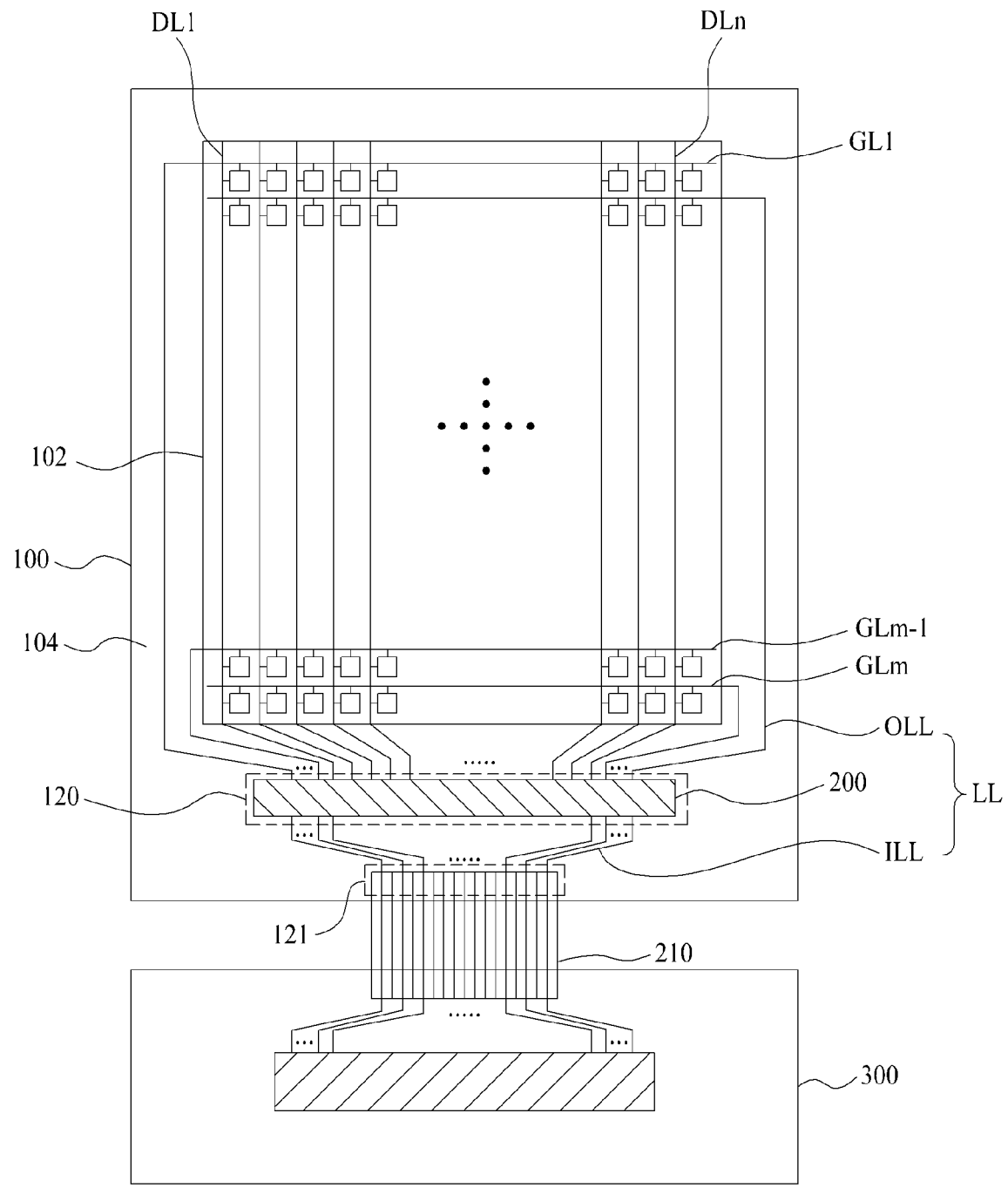
FIG. 3 is a view for schematically describing an FPD device having a plastic display panel according to a first embodiment of the present invention.
Figure 4:
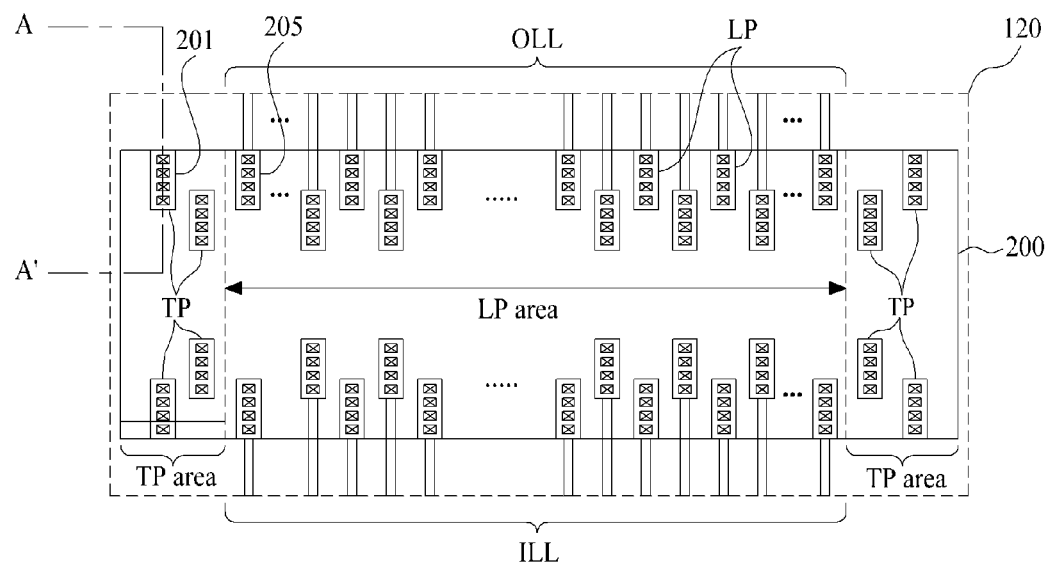
FIG. 4 is a plan view illustrating a state in which a bonding part of a plastic panel is bonded to a driving IC, in the FPD device of FIG. 3.

FIG. 3 is a view for schematically describing an FPD device according to a first embodiment of the present invention. FIG. 4 is a plan view illustrating a state in which a bonding part of a plastic panel is bonded to a driving IC, in the FPD device of FIG. 3.

The FPD device according to the first embodiment of the present invention, as illustrated in FIG. 3, includes a plastic panel 100, a driving IC 200, an FPC 210, and a PCB (main board) 300. All the components of the FPD device or any other display device described herein according to the embodiments of the present invention are operatively coupled and configured.

First, the plastic panel 100 includes a display area 102 that displays an image, and a non-display area 104 corresponding to an area other than the display area 102. The plastic panel 100 may be one of various types of panels, such as a liquid crystal panel, a plasma display panel, an organic light emitting display panel, an EPD panel, etc., depending on the types of the above-described FPD devices. Especially, in the plastic panel 100, a base substrate configuring a lower substrate of the panel 100 is formed of plastic. That is, the plastic panel 100 according to the present invention is configured to include an upper substrate and a lower substrate (118 in FIG. 5) where the lower substrate 118 includes a plastic base substrate (111 in FIG. 5). The plastic base substrate 111 can be formed of a transparent plastic material such as polyimide.

First, the display area 102 includes a plurality of gate lines GL1 to GLm that are arranged at certain intervals, a plurality of data lines DL1 to DLn that are arranged at certain intervals to intersect the gate lines GL1 to GLm, and a plurality of pixels that are respectively formed in a plurality of areas defined by the intersections of the gate lines GL1 to GLm and data lines DL1 to DLn. However, the invention is not limited thereto, but the display area 102 can have any known structure for the display area of any known display device. Hereinafter, the plurality of gate lines and the plurality of data lines can be simply referred to as panel lines (PL) or panel electrodes.

Each of the pixels P may include a thin film transistor (TFT) connected to one gate line GL and one data line DL. Each pixel P displays an image corresponding to a data signal supplied from the data line DL through the TFT. For example, when the plastic panel 100 is a liquid crystal panel including liquid crystal, each pixel P may be a liquid crystal cell that adjusts a light transmittance of the liquid crystal to display an image according to the data signal supplied from the corresponding data line DL through the corresponding TFT.

As another example, when the plastic panel 100 is an EPD panel including an electrophoretic film or an e-ink, each pixel P may be a cell that changes positions of electrified particles contained in the electrophoretic film or the e-ink to adjust an amount of reflected light according to a current corresponding to a data signal supplied from a corresponding data line DL through a corresponding TFT, thereby displaying an image.

Second, the non-display area 104 includes at least one bonding part 120 bonded to the driving IC 200 that supplies a gate signal to the gate lines GL and supplies data signals, synchronized with the gate signal, to the data lines DL. Additionally, the non-display area 104 can include at least one additional bonding part 121 bonded to the FPC 210. The configuration of the bonding part 121 is the same as or similar to that of the bonding part 120, except that the bonding part 121 is for bonding the FPC 210 to the lower substrate 118 of the plastic panel 100 whereas the bonding part 120 is for bonding the driving IC 200 to the lower substrate 118.

Further, a plurality of link lines LL, which link the panel lines (PL) arranged in the display area 102 to the bonding part 120, are arranged in the non-display area 104. The link lines LL may be categorized into a plurality of output link lines OLL and a plurality of input link lines ILL depending on a disposed position with respect to the driving IC 200.

For example, in FIG. 4, a plurality of link lines arranged at a lower end of the driving IC 200 electrically link the FPC 210 to the driving IC 200 and transfer input signals from the FPC 210 to the driving IC 200. Thus, hereinafter, each of such link lines is also referred to as an input link line ILL. Further in FIG. 4, a plurality of link lines arranged at an upper end of the driving IC 200 apply signals output from the driving IC 200 to the panel lines PL. Thus, hereinafter, each of such link lines is also referred to as an output link line OLL. However, a test pad TP (to be described in more detail below) applied in one or more embodiments of the present invention is not electrically (or directly) connected to any of the link lines LL, although the test pad TP is provided in the bonding part 120 adhered to the driving IC 200. In the following description, each of at least one of the input link lines ILL and the output link lines OLL is referred to as a link line, except in a case in which it would be helpful to differentiate between the input link lines ILL and the output link lines OLL. Thus the link lines can be input link lines ILL, output link lines OLL, or any combination of ILL and OLL.

Figure 1:
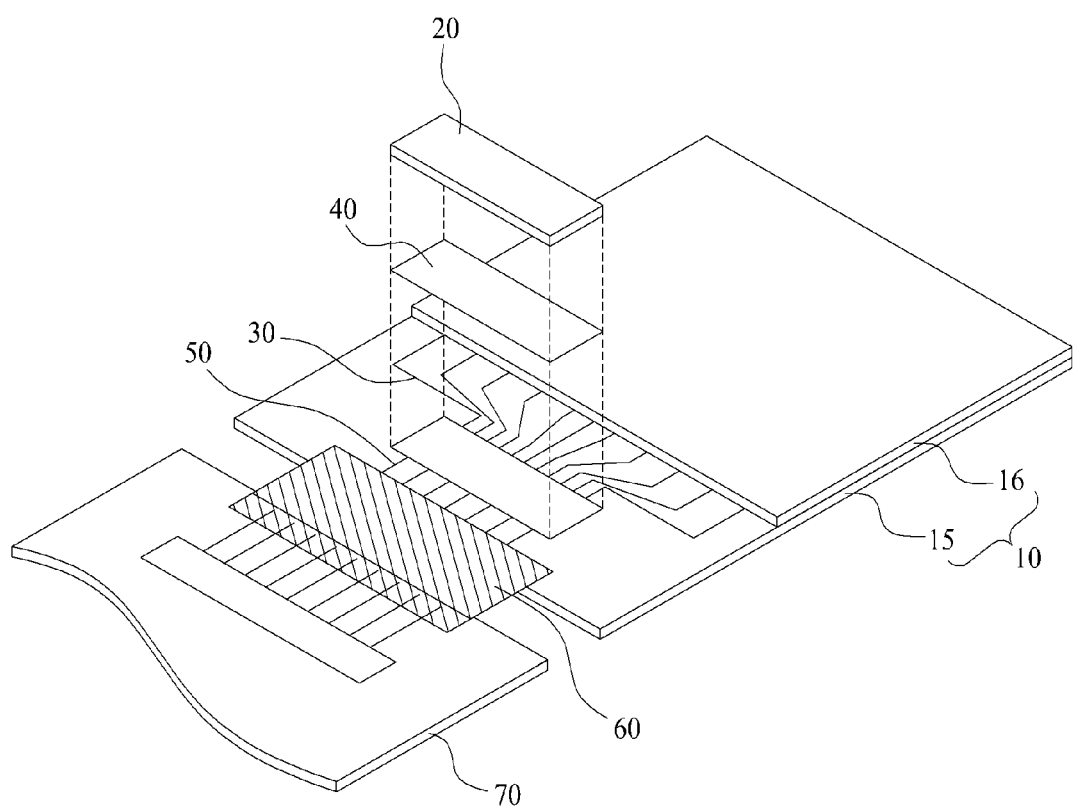
FIG. 1 is a view schematically illustrating a configuration of a general FPD device having a non-plastic display panel.
Figure 2:
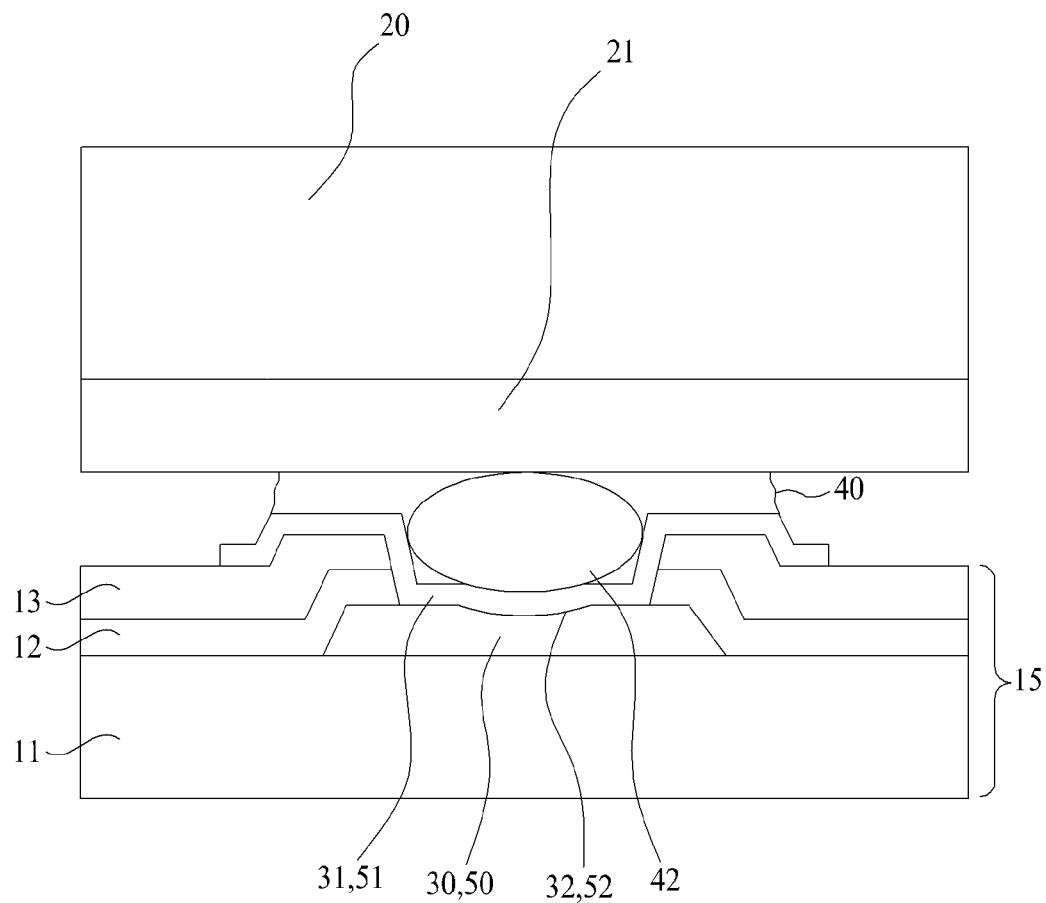
FIG. 2 is a sectional view of an example illustrating a state in which the display panel of FIG. 1 is adhered to a driving IC by a conductive member according to a related art.

Third, as illustrated in FIG. 4, the bonding area 120 includes a link pad (LP) area and a test pad (TP) area which are both provided in the non-display area 104. In the LP area, a plurality of link pads LP are electrically connected to the link lines LL (e.g., OLL and ILL). In the TP area, at least one or more test pads TP, which are not electrically connected to any of the link lines LL (e.g., OLL and ILL), are provided. The link pads LP are electrically connected to the link lines LL, and may be provided in a structure of a pad that is generally provided in a display panel at present. That is, the link pad LP may be variously provided depending on a structure of panel lines arranged in the display area and a structure of link lines arranged in the non-display area. In a preferred example, the link pad LP may have the same configuration as the test pad TP, except that the link pad LP is electrically connected to the corresponding link line (e.g., OLL or ILL) whereas the test pad TP is not electrically connected to any link line. Hereinafter, different examples of a structure of the test pad TP will be described with reference to FIGS. 5 to 7. The structure of the link pad LP then can be the same as the structure of the test pad TP shown in FIGS. 5-7, except that in the link pad LP structure, the link line OLL or ILL such as that shown in FIG. 4 (or in FIG. 2 as the elements 30, 50) would be present below the conductive balls (e.g., 420 in FIG. 5) and directly on the plastic base substrate 111. For instance, in the link pad LP structure, a corresponding link line OLL or ILL is positioned below the conductive balls such as 420.

The driving IC 200 is for applying electrical signals to the panel lines (e.g., GL and/or DL) arranged in the display area 102, and may be provided in various types.

The driving IC 200 may be at least one of a data driver IC for driving the data lines DL1 to DLn of the plastic panel 100, a gate driver IC for driving the gate lines GL1 to GLm of the display panel 100, and a display driver IC (DDI) for integratedly driving the data lines and the gate lines. In the example of FIG. 3, the driving IC 200 is a display driver IC; however, the invention is not limited thereto. That is, the driving IC 200 adhered to the plastic panel 100 according to the embodiments of the present invention may be at least one of the data driver IC, the gate driver IC, and the display driver IC.

In the driving IC 200, a link terminal 205 (e.g., link bump) is connected to the link pad LP and is provided in plurality, and at least one or more test terminals 201 (e.g., test bumps) are connected to one or more the test pads TP. In the example of FIG. 4, two test pads TP are provided at each of the left and right distal ends of an input side and each of the left and right distal ends of an output side, such that namely, a total of eight test pads TP are provided for the bonding part 120. Accordingly, a minimum of eight test terminals 201 then can be provided in the driving IC 200. The test terminals 201 and link terminals 205 can be part of the driving IC 200 or can be separate elements directly attached to the driving IC 200. That is, the test terminals 201 and link terminals 205 can be included in the driving IC 200, whereas the test pads TP and the link pads TP are referred to padded areas of the lower substrate 118, which respectively correspond to the test terminals 201 and link terminals 205.

The FPC 210 electrically connects the PCB 300, which is used as the main board, to the plastic panel 100. The FPC 210 can be naturally bent, and thus, when the PCB 300 electrically connected to the FPC 210 is assembled as a display module together with the plastic panel 100, the FPC 210 may be disposed at a bottom of the plastic panel 100.

As mentioned above, the additional bonding part 121 may include both link pads and test pads (similar to those of the bonding part 120) for the FPC 210. The FPC 210 can include the link terminals for connecting with the link pads and the test pads for connecting with the test pads. For instance, a link pad connected to the link terminals provided in the FPC 210 can be provided at each of distal ends of the input link lines ILL. When a test terminal which is not used to transfer an electrical signal is provided in the FPC 210, a test pad TP not electrically and physically connected to any of the input link lines ILL may be provided in the non-display area of the plastic panel 100 in parallel to distal ends of the input link lines ILL.

That is, when the FPC 210 is connected to the input link lines ILL of the plastic panel 100 with the above-described conductive member in the bonding part 121, the test pads and test terminals described in association with the driving IC 200 may be applied to the FPC 210.

Finally, the PCB 300 is an element that applies electrical signals to the driving IC 200, and is equally called the main board.

Figure 8:
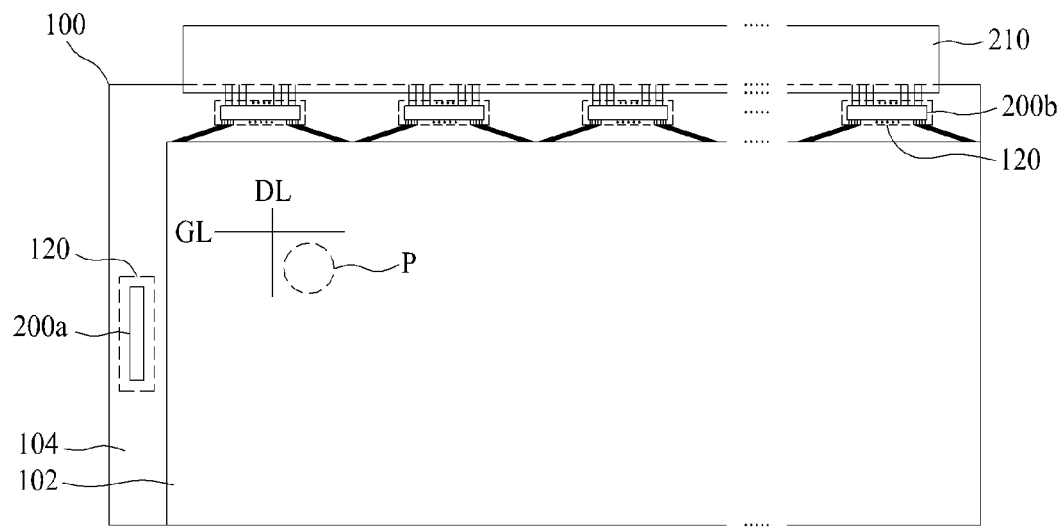
FIG. 8 is a view for schematically describing an FPD device according to a second embodiment of the present invention.

As described above, the test pad TP for the indentation test provided in the plastic panel according to the embodiments of the present invention may be bonded to the FPC 210 as well as the driving IC 200, and, in addition to this or in lieu of, a chip-on film (COF) with the driving IC 200 mounted thereon may be adhered to the test pad TP. FIG. 3 illustrates the FPD device according to the first embodiment of the present invention that includes the bonding part 120, in which the test pad adhered to the driving IC 200 is provided, and the bonding part 121 in which the test pad adhered to the FPC 210 is provided. Especially, the driving IC 200 in the example of FIG. 3 is the display driver IC (DDI) for applying electrical signals to the data lines and the gate lines. FIG. 8 to be described later illustrates an FPD device according to a second embodiment of the present invention in which a data driver IC and a gate driver IC are used as a driving IC. Also, FIG. 9 to be described later illustrates an FPD device according to a third embodiment of the present invention in which a circuit film with a data driver IC mounted thereon and a circuit film with a gate driver IC mounted thereon are adhered to the plastic panel 100 through a bonding part. Hereinafter, any one of the driving IC 200, the FPC 210, and a circuit film with the driving IC 200 mounted thereon may be referred to as a driving element to which the test pad TP and the link pad LP are bonded through the conductive member 400.

Specifically, the test pad TP applied to the embodiments of the present invention is electrically connected by the conductive member (including a plurality of the conductive balls) to a test terminal provided in at least one of the driving IC 200, the FPC 210, and the circuit film 220 with the driving IC 200 mounted thereon, for supplying a certain signal to the link pad. Here, the conductive balls are mere examples and can have any shape and size. As such, the conductive balls are also referred to herein as conductive elements.

Figure 5:
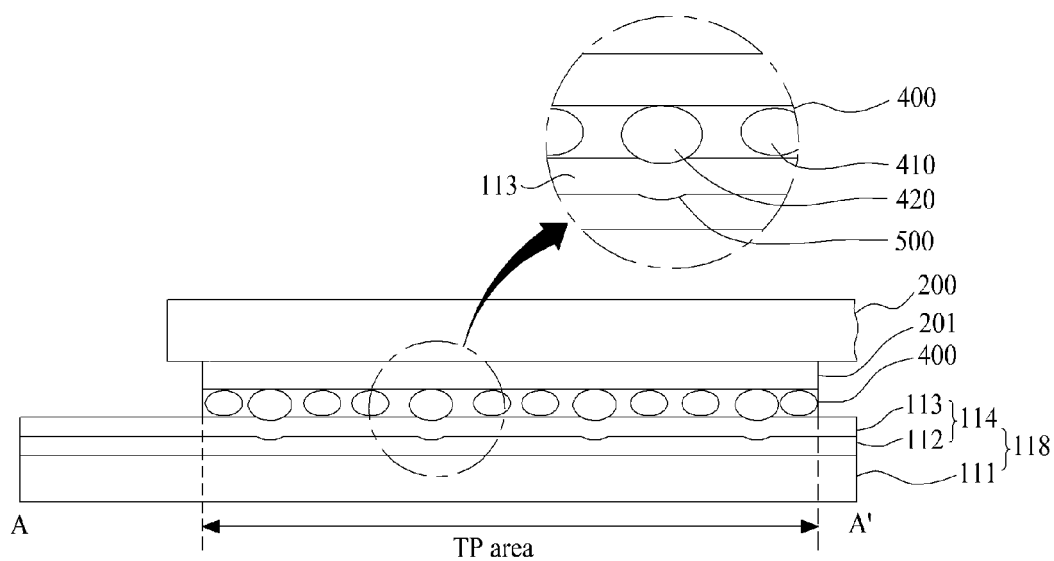
FIG. 5 is a sectional view across a line A-A' of FIG. 4 for illustrating one example of a test pad of the plastic panel applied to the FPD device according to the first embodiment of the present invention.
Figure 6:
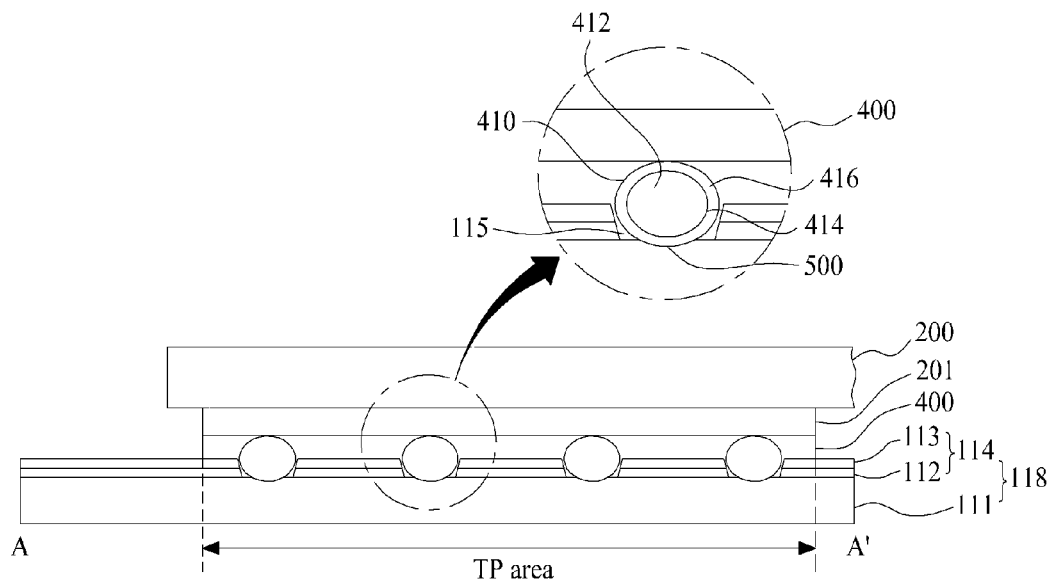
FIG. 6 is a sectional view across a line A-A' of FIG. 4 for illustrating another example of a test pad of the plastic panel applied to the FPD device according to the first embodiment of the present invention.
Figure 7:
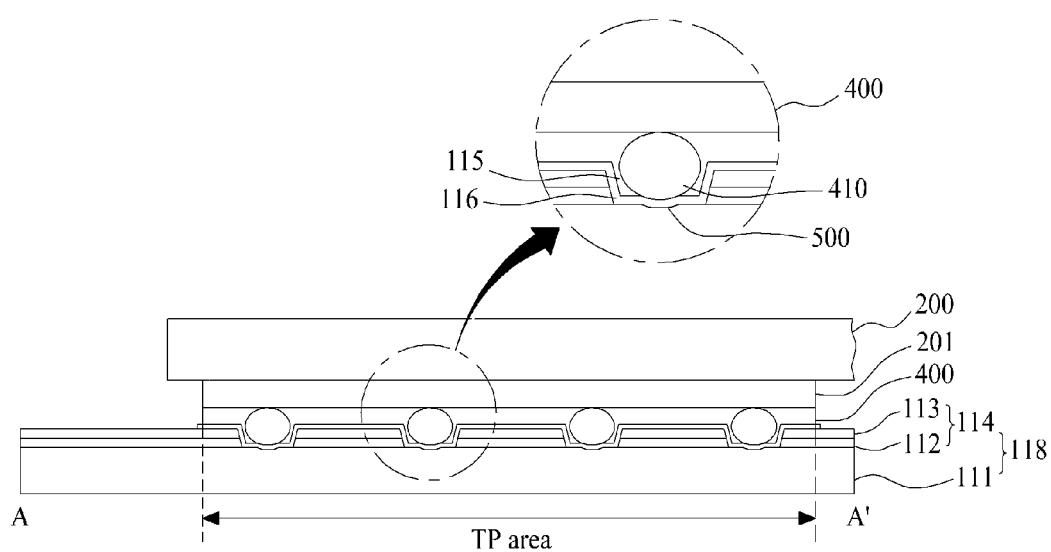
FIG. 7 is a sectional view across a line A-A' of FIG. 4 for illustrating still another example of a test pad of the plastic panel applied to the FPD device according to the first embodiment of the present invention.

FIGS. 5 to 7 are various views illustrating different examples of a connection state between the driving IC and a test pad of the plastic panel applied to the FPD device according to the first embodiment of the present invention. That is, FIGS. 5 to 7 are views illustrating various examples of a sectional surface taken along line A-A' of FIG. 4.

First, as illustrated in one example of FIG. 5, the test pad TP applied to an example of the present invention is provided over a certain range on an insulating layer 114 which is stacked for providing various elements in the display area 102 or the non-display area 104. The conductive member 400, including the plurality of conductive balls 410 for bonding the test pad TP to the test terminal 201 which is disposed in the driving IC 200 for applying electrical signals to the link lines LL, is applied onto an upper end of the test pad TP. An anisotropic conductive film (ACF) may be applied as the conductive member 400. The conductive member 400 includes the plurality of conductive balls 410 and 420 being compressed between the driving IC 200 and the lower substrate 118.

In the above-described configuration, the insulating layer 114 may include a gate insulating layer (or any insulating layer) 112 for insulating the gate lines (stacked on the plastic base substrate 111 used as the base substrate of the plastic panel 100) from other semiconductor layers stacked on the gate lines, and a passivation layer 113 for protecting various semiconductor layers formed on the gate insulating layer 112.

That is, as illustrated in FIG. 5, the bonding part 120 according to the embodiments of the present invention may include a portion of the insulating layer 114 stacked on the plastic base substrate 111. Similarly, the bonding part 121 may include a portion of the insulating layer 114 of the lower substrate 118 of the plastic panel 100.

In the example of FIG. 5, the test terminal 201 of the driving IC 200 is bonded to the test pad TP area with the conductive balls 410 of the conductive member (ACF) 400. For example, when the conductive member 400 including the conductive balls 410 is applied onto the test pad TP, the test terminal 201 is bonded to the test pad TP as the driving IC 200 is thermally compressed towards the lower substrate 118. Thus, an indentation 500 is formed by the squashing of the conductive balls 410 (hereinafter referred also referred to as dented conductive balls 420). For instance, the conductive balls 410 are squashed by the thermal pressurization. As a result, the indentations 500 are formed on the insulating layer 114 configuring the test pad TP.

Here, the indentation 500 denotes a squashed mark, when the conductive ball 410 is compressed between the test terminal 201 and the insulating layer 114, which is formed on the transparent electrode or the link line by the compression of the conductive ball 410.

The indentation 500 of a dented/compressed conductive ball 420 formed on the insulating layer 114 enables a test, which is performed by an optical method after bonding of the driving IC 200, for verifying an electrical connection state between the plastic panel 100 and the link terminals of the driving IC 200.

For example, if there is a sufficient number of indentations created by a plurality of the dented conductive balls 420 in the test pad TP area, then that determination denotes that the test terminal 201 is closed adhered to the test pad TP in the driving IC 200, and denotes that the link terminal 210 is closely adhered to the link pad LP in the driving IC 200 for adequate electrical connection.

To provide an additional description, the conductive member 400 is evenly applied to the test pad TP and the link pad LP, the test terminals 201 and link terminals 210 of the driving IC 200 are disposed on the test pad TP and the link pad LP through the conductive member 400, and the driving IC 200 is evenly pressed downwardly towards the lower substrate 118 at a constant pressure so that the driving IC 200 is bonded to the lower substrate 118.

After the driving IC 200 is bonded to the plastic panel 100 through the bonding part 120, there would exist a number of indentations formed on the test pad TP which denotes there also is a number of indentations formed on the link pad LP. For example, by examining the number of indentations 500 formed on the test pad TP and using that number to estimate the number of indentations formed on the link pad TP (e.g., using a proportionality or a ratio between the number of link pads and the number of test pads), it is possible to test and verify a bonding state between the plastic panel 100 and the driving IC 200. As such, the test for verifying that the driving ICs are electrically connected to the link lines according to this example of the present invention is possible without measuring the indentations formed on the link pads LP, but by merely examining or measuring only the indentations formed on the test pads TP.

In this case, since only the test pad TP (and not the link pad LP) is viewed using a microscope and/or camera under the substrate 118, when viewing an indentation from a lower end of the plastic base substrate 111 (e.g., formed of a transparent plastic material) to verify adequate electrical connection between the driving ICs and the link lines, the indentations 500 can be better viewed because there is no opaque metal layer (link lines OLL, ILL) below the conductive balls 410, 420 which is obstructing the viewing of the indentations 500.

In one example, since a structure of the link pad LP differs from that of the test pad TP, the number or form of indentations viewed through the test pad TP may not match the number or form of indentations formed on the link pad LP in a one-to-one corresponding relationship. Therefore, an operation that applies information on the indentations of the test pad TP to the link pad LP is provided in the present invention for determining whether a bonding state is normal in the link pad LP. For example, in a case in which a repetitive test result shows that an average of ten indentations 500 are viewed in the test pad TP, whether the link pad LP is properly bonded to the link terminal 210 may be determined based on the above-described ratio.

FIG. 6 is a sectional view across a line A-A' of FIG. 4 for illustrating another example of a test pad of the plastic panel applied to the FPD device according to the first embodiment of the present invention.

In this example of test pad according to the present invention, as illustrated in FIG. 6, at least one or more via holes 115 are formed in the insulating layer 114 stacked for forming an element in the display area 102 or the non-display area 104, and surfaces of the plastic base substrate 111 are exposed through the via hole(s) 115. In the following description, a description identical or similar to the description of FIG. 5 may not provided or may be simply made for the sake of brevity.

The conductive member 400 is bonded to the plastic base substrate 111 through the via hole 115. The via holes 115 disposed in the test pad TA areas expose surfaces of the plastic base substrate 111. The conductive member 400 is for bonding the test pad TP to the test terminal 201 provided in the driving IC 200 for applying electrical signals to the link lines LL, and includes the plurality of conductive balls 410 disposed in the via holes 115. Each conductive ball/element 410 in this and other examples/embodiments can be composed of a plastic core 412 (e.g., in the shape of a ball), a conductive coating layer 414 which coats the entire outer surface of the plastic core 412, and an adhesive insulating outer shell 416 which completely covers the plastic core 412 that has been coated with the conductive coating layer 414. The conductive coating layer 414 can be formed of any conductive material. The adhesive insulating outer shell 416 can be formed of an adhesive and insulating material and coats the entire outer surface of the conductive coating layer 414.

When the conductive balls 410 are compressed between the test terminals 201 and the plastic base substrate 111, the compression causes the adhesive insulating outer shell 416 to break and thereby expose the conductive coating layer 414. The exposed conductive coating layer 414 then contacts the test terminals 201 and the surfaces of the plastic base substrate 111. In this case, the indentations 500 may be formed in the surfaces of the plastic base substrate 111 at the via holes 115 by the plurality of conductive balls 410 that have been compressed.

As described above, the ACF may be applied as the conductive member 400. The insulating layer 114 may include the gate insulating layer 112 and the passivation layer 113.

By removing a portion of the insulating layer 114 (e.g., portions of the layers 112 and 113) formed on the plastic base substrate 111, the via hole 115 is formed in order for the plastic base substrate 111 to be exposed. An operation of forming the via hole 115 may be performed simultaneously with an operation that forms a link line via hole for externally exposing the link lines LL, covered by the insulating layer, in the link pads LP provided in the bonding part 120.

For example, in the link pad LP, the link line covered by the insulating layer 114 is externally exposed through the link line via hole, for electrically connecting the link line to the link terminal of the driving IC 200. An operation of forming the via hole 115 may be performed simultaneously with the above-described operation of forming the link line via hole.

In this case, a test terminal 201 of the driving IC 200 is bonded to the test pad TP with the conductive balls 410 of the conductive member (ACF) 400. For example, when the conductive member 400 including the conductive balls 410 is applied onto the test pad TP, some of the conductive balls 410 are inserted into corresponding via holes 115 and bonded to the plastic base substrate 111. In this state when the test terminal 201 is being bonded to the test pad TP, dented conductive balls 410 are formed by the thermal pressurizing of the driving IC 200 towards the conductive balls 410 against the plastic substrate 111. The dented conductive balls 410 refer to the conductive balls 410 that have been squashed by the driving IC 200 so that the outer shells 416 have been broken and the exposed conductive layers 414 of the balls 410 are in direct contact with the terminals 201 and the exposed portions of the plastic substrate 111. Further, the indentation 500 may be formed by the squashing made by the dented conductive ball 410, on the plastic base substrate 111 adjacent to the via holes 115 configuring the test pad TP.

The squashed shape of the dented conductive ball 420 in the via hole 115 enables a test according to the present invention which allows verification that a proper electrical connection is made between the plastic panel 100 and the link terminals of the driving IC 200. To test, a microscope disposed under the substrate 111 can be used to view the shape of the conductive balls 410 in the via holes 115. If the shapes of the conductive balls 410 seem flattened or crushed, that would indicate that the outer shells 416 of the balls 410 are broken and that the conductive coating layers 414 are exposed to be in contact with the terminals 201 and the exposed areas of the substrate 111. Since the base substrate 111 is transparent and there are no link lines (metal lines) present between the conductive balls 410 and the substrate 111 in the test pad TP area, the present invention allows an easy and accurate viewing of the shape of the conductive balls 115 by using an image capturing unit such as a microscope, camera, or others. In the example of FIG. 6, additionally, a method which uses the indentations 500 (e.g., as in the example of FIG. 5) may be applied supplementally if desired.

Any number of the via holes 115 may be formed in one test pad TP, and as an example only, FIGS. 4 and 6-7 illustrate the plastic panel 100 in which four via holes 115 are formed in each test pad TP.

In still another example of test pad according to the present invention, as illustrated in FIG. 7, at least one or more via holes 115 are formed in the insulating layer 114 stacked for forming an element in the display area 102 or the non-display area 104. Further, a transparent electrode 116 is stacked on the via hole(s) 115 and on the portions of the passivation layer 113. In the following description, a description identical or similar to the description of FIG. 6 is not provided or will be simply made for the sake of brevity. The configuration of FIG.

7 is identical to that of FIG. 6, except that in FIG. 7 a transparent electrode 116 is formed directly on the insulating layer 114 and in the via holes 115.s The conductive member 400 is applied onto the transparent electrode 116 through the via holes 115. The conductive member 400 is for bonding the test pad TP to the test terminal 201 provided in the driving IC 200 for applying electrical signals to the link lines LL, and includes the plurality of conductive balls 410. In this case, indentations 500 are formed in the transparent electrode 116 by the squashing of the conductive balls 410. When the via hole 115 is formed in plurality in the test pad TP, the transparent electrode 116 is connected to or is formed directly in all of the via holes 115 of the test pads TP.

The conductive member 400 is applied onto the plastic base substrate 111 through the via holes 115. The conductive member 400 is for bonding the test pad TP to the test terminal 201 provided in the driving IC 200 for applying electrical signals to the link lines LL, and includes the plurality of conductive balls 410. In this case, the indentations 500 are formed in the plastic base substrate 111 by the squashing of the conductive balls 410.

As described above, the ACF may be applied as the conductive member 400. The insulating layer 114 may include the gate insulating layer 112 and the passivation layer 113.

By removing a portion of the insulating layer 114 formed on the plastic base substrate 111, the via hole 115 is formed in order to expose surfaces of the plastic base substrate 111. An operation of forming the via hole 115 may be performed simultaneously with an operation that forms a link line via hole for externally exposing the link lines LL, covered by the insulating layer, in the link pads LP provided in the bonding part 120.

That is, in the same manner as described in connection with FIG. 6, in the link pad LP according to FIG. 7, the link line covered by the insulating layer 114 is externally exposed through the link line via hole, for electrically connecting the link line to the link terminal 205 of the driving IC 200. An operation of forming the via hole 115 may be performed simultaneously with the above-described operation of forming the link line via hole.

Further an operation of forming the transparent electrode 116 in the via hole 115 may be performed simultaneously with an operation of forming a link line transparent electrode deposited in the link line via hole. Such operations are known.

For instance, in the link pad LP, the link line transparent electrode is formed in the link line via hole, for electrically connecting the link line to the link terminal of the driving IC 200, and the conductive member 400 is applied onto the link line transparent electrode. The transparent electrode 116 in the via holes 115 of the test pad TP areas may be formed simultaneously with the link line transparent electrode.

The transparent electrode 116 may be formed of one transparent material among ZnO, ZnO:B, ZnO:Al, SnO2, SnO2:F, indium tin oxide (ITO), indium zinc oxide (IZO), indium tin zinc oxide (ITZO), zinc tin oxide (ZTO), and antimony tin oxide (ATO).

In this case, a test terminal 201 of the driving IC 200 is bonded to the test pad TP with the conductive balls 410 of the conductive member (ACF) 400. The conductive ball 410 in FIG. 7 and in other figures has the same structure and configuration as the conductive ball 410 of FIG. 6, e.g., elements 412, 414, 416. When the conductive member 400 including the conductive balls 410 is applied onto the test pad TP, some of the conductive balls 410 are inserted into corresponding via holes 115 and bonded to the test pad TP. In this state, the test terminal 201 is bonded to the test pad TP by thermally pressuring the driving IC 200 towards the lower substrate 115. Thus, the dented conductive balls 410 are formed and the indentation 500 may be formed by the squashing of the dented conductive ball 410, on the transparent electrode 116 formed in the via holes 115 configuring the test pad TP. Further, the indentation 500 may be formed even at a surface of the transparent electrode 116 formed outside the via hole 115.

The indentation 500 of the dented conductive ball 410, which is formed on the transparent electrode 116 through the via hole 115, enables a test, which is performed by an optical method after the bonding of the driving IC 200 is completed, for indicating a connection state between the plastic panel 100 and the link terminals of the driving IC 200.

In the example of FIG. 7, the test method(s) used in the test methods of FIGS. 5 and/or 6 may be used. For instance, the shape of the conductive balls 410 and/or the dents 500 may be checked to verify the proper electrical connection between the link terminals and the link lines.

In another example, since no link line is provided in the test pad TP or is electrically connected to the test terminal, the form or structure of the link pad LP may not be identical to that the test pad TP since the link pad LP is electrically connected to the link line. Therefore, the number or form of the indentations formed in the transparent electrode of the test pad TP may not be the same as those of the indentations formed in the transparent electrode of the link pad LP. However, the numbers or forms of the indentations formed in the link pads and the test pads have a proportional relation to each other. Thus, before performing an indentation testing process for the plastic panel according to the present invention in a manufacturing process, information on the above-described proportional relationship can be collected by a repeated test, and a database of the collected information can be built. Subsequently, in the actual indentation testing process performed in the manufacturing process according to the present invention, indentation information on the link pad LP may be estimated from the information on the indentations of the test pad TP obtained by the actual indentation testing process performed on the test pad TP, based on the previously collected proportionality information stored in the database. As a result, the present invention provides a reliable determination on whether the link pads LP provided in the bonding part 120 of the plastic panel 100 are normally bonded to the link terminals provided in the driving IC 200 by testing only the test TP and not the link pad LP.

Further, in this case, when viewing the shape of the conductive balls 410 and/or the indentation 500 (formed in the transparent electrode 116) from a lower end of the plastic base substrate 111, the shapes of the conductive balls 410 and/or indentations 500 in the test pad TP area can be better viewed because there is no opaque metal layer such as the link line that would obstruct this viewing.

FIG. 8 is a view for schematically describing an FPD device according to a second embodiment of the present invention. In the following description, a description identical or similar to the first embodiment of the present invention described above with reference to FIGS. 3 to 7 is not provided or will be simply made for the sake of brevity.

Referring to FIG. 8, the FPD device according to the second embodiment of the present invention includes a plastic panel 100, at least one or more gate driver ICs 200a, at least one or more data driver ICs 200b, and an FPC 210.

The FPC 210 of FIG. 8 may perform only a link function that links the data driver ICs 200b to a PCB (main board, such as 300 in FIG. 3), similarly to the FPC 210 of FIG. 3, or act as the main board on which elements, such as a timing controller, are mounted.

The plastic panel 100 includes a display area 102 that displays an image, and a non-display area 104 corresponding to an area other than the display area 102.

The display area 102 includes a plurality of gate lines GL that are arranged at certain intervals, a plurality of data lines DL that are arranged at certain intervals to intersect the gate lines GL, and a plurality of pixels P that are respectively formed in a plurality of areas defined by intersections of the gate lines GL and data lines DL. Each of the pixels P may include a thin film transistor (TFT) connected to one gate line GL and one data line DL.

In the non-display area 104, the at least one or more gate driver ICs 200a for supplying gate signals to the gate lines GL are bonded to the plastic panel 100 though the above-described bonding part 120 of the present invention. Moreover, the at least one or more data driver ICs 200b for supplying data signals synchronized with the gate signals to the data lines DL are bonded to the plastic panel 100 though the above-described bonding part 120 of the present invention. That is, each of the driver ICs 200a, 200b may be bonded to the lower substrate 115 of the plastic panel 100 by using the same bonding part 120 and its configuration described above.

For instance, each of the at least one gate driver IC 200a is bonded to the non-display area 104 of one side of the plastic panel 100 corresponding to one side of each of the gate lines GL, and sequentially supplies the gate signal to the gate lines GL. To this end, at least one or more bonding parts 120 are prepared in the non-display area 104 of one side of the plastic panel 100, and as described above, include a plurality of link pads LP and at least one or more test pads TP described above in connection with FIGS. 3-7.

Similarly, each of the at least one data driver IC 200b is bonded to the non-display area 104 of an upper side of the plastic panel 100 corresponding to one side of each of the data lines DL, and supplies data signals to the data lines DL. To this end, at least one or more bonding parts 120 are prepared in the non-display area 104 of one side of the plastic panel 100, and as described above, include a plurality of link pads LP and at least one or more test pads TP described above in connection with FIGS. 3-7.

The gate driver IC 200a and the data driver IC 200b are another example of the driving element, especially, the driving IC 200, which has been described above in the first embodiment, and the gate driver IC 200a and the data driver IC 200b are bonded to the bonding part(s) 120 of the plastic panel 100 by the same method as the driving IC 200 that has been described above in the first embodiment.

After the gate driver IC 200a and the data driver IC 200b are bonded to the bonding part(s) 120 of the plastic panel 100 by the squashing of the conductive balls 410, 420 as in the first embodiment of the present invention, the FPD device according to the second embodiment of the present invention enables a test, performed by an optical method, for indicating a connection state of the conductive ball 420, thereby enabling a detection of a defective connection due to the conductive ball 420.

Figure 9:
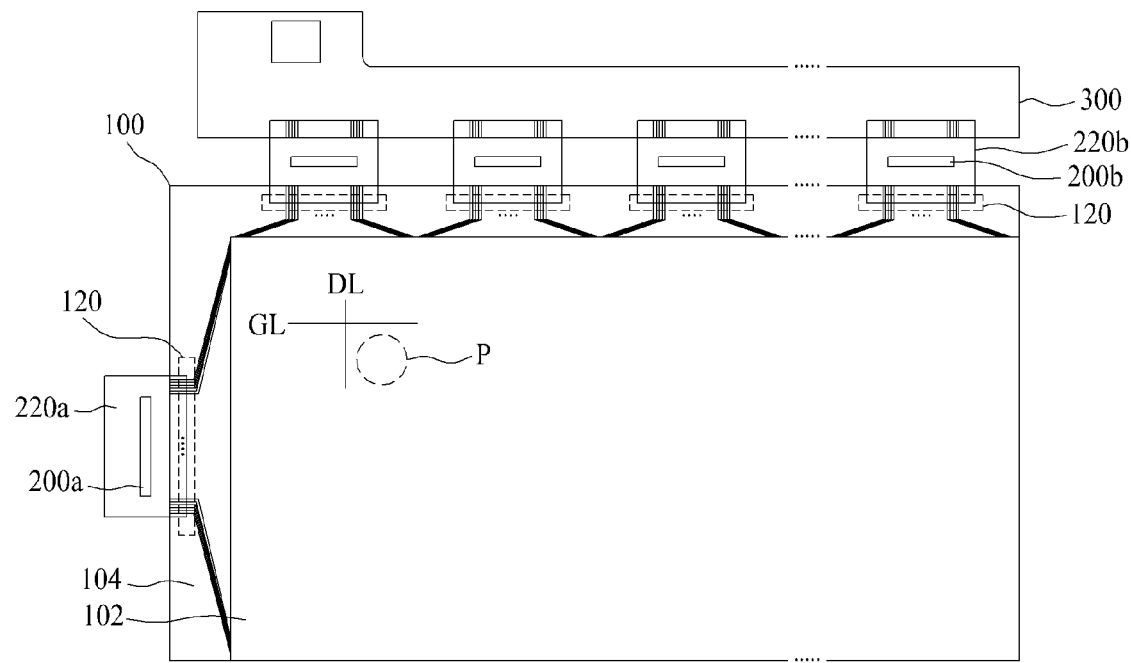
FIG. 9 is a view for schematically describing an FPD device according to a third embodiment of the present invention.

FIG. 9 is a view for schematically describing an FPD device according to a third embodiment of the present invention. In the following description, a description identical or similar to the first or second embodiment of the present invention described above with reference to FIGS. 3 to 8 is not provided or will be simply made for the sake of brevity.

The FPD device according to the third embodiment of the present invention includes a plastic panel 100, a circuit film 220a with a gate driver IC 200a mounted thereon, a circuit film 220b with a data driver IC 200b mounted thereon, and a PCB (main board) 300. The plastic panel 100 includes a display area 102 that displays an image, and a non-display area 104 corresponding to an area other than the display area 102.

In the non-display area 104, at least one or more circuit films 220a, on which the gate driver IC 200a for supplying a gate signal to a plurality of gate lines GL are mounted, are bonded to the plastic panel 100 though a bonding part 120 having the same configuration as the bonding part 120 described above.

At least one or more circuit films 220b with the data driver IC 200b mounted thereon are bonded to the plastic panel 100 through the bonding part 120 provided in the non-display area 104 of one side of the plastic panel 100 corresponding to one side of each of a plurality of data lines DL, and supplies data signals, output from the data driver IC 200b, to the data lines DL.

A plurality of link terminals and at least one or more test terminals, which are provided in one side of the circuit film 220a with the gate driver IC 200a mounted thereon or one side of the circuit film 220b with the data driver IC 200b mounted thereon, as described above, are bonded to the plurality of link pads LP and at least one or more test pads TP that are provided in the bonding part 120, with a conductive member 400 in the same manner as that was described in the first and second embodiments.

The PCB 300 is electrically connected to the circuit film 220b with a plurality of data driver ICs 200b mounted thereon by conductive balls of a conductive member (ACF) in a tape automated bonding (TAB) type. A timing controller and other units are mounted on the PCB 300. Therefore, the PCB 300 is also known as the main board.

The circuit film 220a with the gate driver IC 200a mounted thereon and the circuit film 220b with the data driver IC 200b mounted thereon are an example of the driving element (i.e., the circuit film with the driving element), especially, the driving IC mounted thereon, which has been described above in the first embodiment. The circuit film 220a with the gate driver IC 200a mounted thereon and the circuit film 220b with the data driver IC 200b mounted thereon are bonded to one or more bonding parts 120 of the plastic panel 100 by the same method as the driving IC 200 that has been described above in the first embodiment.

After the circuit film 220a with the gate driver IC 200a mounted thereon and the circuit film 220b with the data driver IC 200b mounted thereon are bonded to the bonding part(s) 120 of the plastic panel 100 by the squashing (indentation) of the conductive balls 420 as in the first and second embodiments of the present invention, the FPD device according to the third embodiment of the present invention enables a test, performed by an optical method, for indicating a connection state of the conductive ball 420, thereby enabling a detection of a defective connection due to the conductive ball 420 by merely viewing the state of the test pads TP and not the link pads LP.

In view of the above, the embodiments of the present invention provide at least the following advantages.

The embodiments of the present invention allows a verification for proper electrical connection when bonding the driving elements 200, 210, 220a and 220b to the plastic panel 100, by using the conductive member 400 including the conductive balls 410. In the embodiments of the present invention, the at least one or more test pads TP able to be bonded to the test terminals 201 provided in the driving elements are provided in the bonding part 120 in which the plastic panel 100 is bonded to the driving elements 200, 210, 220a and 220b.

Since an opaque metal layer (link line) is removed from or is not present in the test pad TP provided in the bonding part 120, the shapes of the conductive balls 410 and/or the indentation 500 to be viewed from the lower surface of the plastic base substrate 111 can be viewed and recognized without obstruction. Further, an observation of the shapes of the conductive balls and/or the indentations made in the test pads TP can be used to determine whether or not the link lines are properly electrically connected to the driving element 200, 210, 220a, 220b, etc.

Accordingly, the present invention can enhance a yield rate of the plastic panel, and a defect can be easily detected.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A plastic display panel, comprising:
    a display area configured to display an image and including a plurality of panel electrodes; and
    a non-display area in which a plurality of link lines connected to the panel electrodes and a driving element are provided,
    wherein,
    the display area and the non-display area are provided in a plastic base substrate,
    a plurality of link pads, electrically connected to the respective link lines, are provided in a bonding part adhered to the driving element in the non-display area, and
    at least one via hole is provided in the bonding part for exposing a portion of the plastic base substrate,
    wherein the at least one via hole is positioned over an area that does not include any of the link lines connected to the panel electrodes.

2. The plastic display panel of claim 1, wherein the bonding part includes a link pad area having the plurality of link pads, and at least one test pad area having the at least one via hole.

3. The plastic display panel of claim 2, wherein the at least one test pad area includes at least one test pad which is not electrically connected to any of the link lines.

4. A flat panel display device, comprising:
    the plastic display panel of claim 3; and
    the driving element configured to apply electrical signals to the link lines, and including at least one link terminal connected to the corresponding link pad, and at least one test terminal connected to the at least one test pad.

5. The plastic display panel of claim 2, wherein,
    the at least one via hole is provided in the at least one test pad area, and a conductive member including a plurality of conductive elements are applied onto the at least one via hole.

6. The plastic display panel of claim 5, further comprising:
    a transparent electrode formed directly on the exposed portion of the plastic base substrate in the at least one via hole.

7. The plastic display panel of claim 6, wherein the plurality of conductive elements are formed directly on the transparent electrode in the at least one via hole.

8. The plastic display panel of claim 6, wherein indentations are formed in the plastic base substrate by the plurality of conductive elements pressing against the transparent electrode in the at least one via hole.

9. The plastic display panel of claim 6, wherein at least one of the plurality of conductive elements comprises a breakable outer insulating layer and an inner conductive layer, and
    wherein the breakable outer insulating layer is configured to break and expose the inner conductive layer.

10. The plastic display panel of claim 1, wherein the driving element is one of the following:
    a flexible printed circuit (FPC),
    a driving integrated circuit (IC), and
    a circuit film with the driving IC mounted thereon, for supplying a certain signal to the corresponding link pad.

11. The plastic display panel of claim 1, wherein the plastic base substrate is made of a transparent material.

12. A flat panel display device comprising:
    a plastic display panel including a base substrate made of plastic and a plurality of data lines and gate lines formed on the plastic base substrate; and
    a driving element configured to apply electrical signals to at least one of the data and gate lines,
    wherein the plastic display panel further includes:
    a plurality of link pads formed on the plastic base substrate, each of the link pads electrically connected to one of the data and gate lines,
    a plurality of via holes disposed adjacent to the link pads on the plastic base substrate, and
    a plurality of conductive elements formed in the plurality of via holes,
    wherein each of the plurality of via holes is positioned over an area that does not include any of the data and gate lines.

13. The flat panel display device of claim 12, wherein the plurality of via holes expose portions of the plastic base substrate, and the plurality of conductive elements contact the exposed portions of the plastic base substrate in the plurality of via holes.

14. The flat panel display device of claim 12, wherein the plastic display panel further comprises:
    a transparent electrode formed in the plurality of via holes.

15. The flat panel display device of claim 14, wherein the plurality of conductive elements contact the transparent electrode formed in the plurality of via holes.

16. The flat panel display device of claim 12, wherein the driving element is one of the following:
    a flexible printed circuit (FPC),
    a driving integrated circuit (IC) configured to drive at least one of the data and gate lines, and
    a circuit film with the driving IC mounted thereon.

17. The flat panel display panel of claim 12, wherein the plastic base substrate is made of a transparent material.

18. The flat panel display panel of claim 12, wherein at least one of the plurality of conductive elements comprises a breakable outer insulating layer and an inner conductive layer, and
    wherein the breakable outer insulating layer is configured to break and expose the inner conductive layer.

* * * * *